(12) United States Patent
Jang

(10) Patent No.: US 8,665,182 B2
(45) Date of Patent: Mar. 4, 2014

(54) EMISSION CONTROL DRIVER AND ORGANIC LIGHT EMITTING DISPLAY DEVICE USING THE SAME

(75) Inventor: Hwan-Soo Jang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 365 days.

(21) Appl. No.: 12/609,001

(22) Filed: Oct. 29, 2009

(65) Prior Publication Data

US 2010/0188381 A1 Jul. 29, 2010

(30) Foreign Application Priority Data

Jan. 29, 2009 (KR) .................. 10-2009-0006908

(51) Int. Cl.
*G09G 3/30* (2006.01)
(52) U.S. Cl.
USPC .............................. 345/76; 345/82
(58) Field of Classification Search
USPC .............. 345/42, 45, 46, 76–83, 100; 315/169.1–169.4
See application file for complete search history.

(56) References Cited

U.S. PATENT DOCUMENTS

| | | | |
|---|---|---|---|
| 2006/0156121 A1* | 7/2006 | Chung .......................... | 714/726 |
| 2007/0040771 A1* | 2/2007 | Chung et al. .................... | 345/76 |
| 2007/0040786 A1* | 2/2007 | Chung ............................. | 345/92 |
| 2007/0262929 A1* | 11/2007 | Kim et al. ....................... | 345/76 |

FOREIGN PATENT DOCUMENTS

| | | |
|---|---|---|
| JP | 2007-140318 | 6/2007 |
| KR | 10-2006-0114471 A | 11/2006 |
| KR | 10-0646992 B1 | 11/2006 |
| KR | 10-0685833 B1 | 2/2007 |
| KR | 10-2008-0027062 A | 3/2008 |

OTHER PUBLICATIONS

KIPO Office action dated Sep. 30, 2010 in Korean priority application No. 10-2009-0006908.
KIPO Office Action dated May 26, 2011 for KR Application No. 10-2009-0006908 (1 page).

* cited by examiner

*Primary Examiner* — Chanh Nguyen
*Assistant Examiner* — Sanghyuk Park
(74) *Attorney, Agent, or Firm* — Christie, Parker & Hale, LLP

(57) ABSTRACT

An emission control driver includes a plurality of stages, each of the plurality of stages including an output terminal coupled to a corresponding one of the emission control lines; input terminals respectively coupled to two or more scan lines of the scan lines for generating a corresponding one of the emission control signals; an input circuit for controlling voltages at a first node and a second node corresponding to scan signals supplied from the two or more scan lines; and an output circuit coupled to the input circuit, the output circuit for controlling the corresponding one of the emission control signals according to the voltages at the first node and the second node.

16 Claims, 6 Drawing Sheets

EMISSION CONTROL DRIVER AND ORGANIC LIGHT EMITTING DISPLAY DEVICE USING THE SAME

CROSS-REFERENCE TO RELATED APPLICATIONS

This application claims priority to and the benefit of Korean Patent Application No. 10-2009-0006908, filed on Jan. 29, 2009, in the Korean Intellectual Property Office, the entire content of which is incorporated herein by reference.

BACKGROUND OF THE INVENTION

1. Field of the Invention

The present invention relates to an emission control driver and an organic light emitting display device using the same.

2. Description of Related Art

Recently, various types of flat panel display devices have been developed having reduced weight and volume compared to cathode ray tubes. Such flat panel display devices include liquid crystal display devices, field emission display devices, plasma display panels, and organic light emitting display devices, among others.

Among these flat panel display devices, the organic light emitting display device displays images using organic light emitting diodes that emit light through the recombination of electrons and holes. The organic light emitting display device has a fast response time and is driven with low power consumption. In a conventional organic light emitting display device, current corresponding to a data signal is supplied to an organic light emitting diode using a transistor in each pixel, so that light is generated from the organic light emitting diode.

The conventional organic light emitting display device includes a data driver for supplying data signals to data lines; a scan driver for sequentially supplying scan signals to scan lines; an emission control driver for supplying emission control signals to emission control lines; and a display unit including a plurality of pixels coupled to the data lines, the scan lines and the emission control lines.

When a scan signal is supplied to a scan line, pixels included in the display unit are selected and receive data signals supplied from the data lines, respectively. The pixels receiving the respective data signals generate light with predetermined luminances corresponding to the data signals, thereby displaying a predetermined image. Here, the emission time of each of the pixels is controlled by an emission control signal supplied from an emission control line. Generally, an emission control signal is supplied to overlaps with the scan signal supplied to one or two scan lines, and sets pixels to which data signals are supplied to be in a non-emission state.

To this end, a conventional emission control driver includes stages respectively coupled to emission control lines. Each of the stages receives four or more clock signals and outputs a low voltage to an output line corresponding to the clock signals.

However, since each of the stages included in the conventional emission control driver is driven by the four or more clock signals, a large number of transistors are included in each of the stages. Therefore, manufacturing cost is increased, and it is difficult to ensure reliability. Further, since each of the stages includes a large number of transistors and is driven by the four or more clock signals, the mounting area of the emission control driver is increased.

SUMMARY OF THE INVENTION

Accordingly, exemplary embodiments of the present invention provide an emission control driver for generating emission control signals using scan signals, and an organic light emitting display device using the same.

Exemplary embodiments of the present invention also provide an emission control driver having a reduced or minimal number of transistors included in the emission control driver, thereby reducing manufacturing costs and reducing mounting area, and an organic light emitting display device using the emission control driver.

According to an aspect of an exemplary embodiment of the present invention, there is provided an emission control driver for supplying emission control signals to emission control lines formed in parallel with scan lines, the emission control driver including a plurality of stages, each of the plurality of stages including an output terminal coupled to a corresponding one of the emission control lines; input terminals respectively coupled to two or more scan lines of the scan lines for generating a corresponding one of the emission control signals; an input circuit for controlling voltages at a first node and a second node corresponding to scan signals supplied from the two or more scan lines; and an output circuit coupled to the input circuit, the output circuit for controlling the corresponding one of the emission control signals according to the voltages at the first node and the second node.

The output circuit may include a first transistor between a first power source and the output terminal, the first transistor being controlled corresponding to the voltage at the first node; a second transistor between the output terminal and a second power source, the second transistor being controlled corresponding to the voltage at the second node; a third transistor between the first node and the first power source, the third transistor being controlled corresponding to the voltage at the second node; a first capacitor between a gate electrode of the second transistor and the output terminal; and a second capacitor between a gate electrode of the first transistor and the first power source.

The input circuit may include a fourth transistor between the first node and the second power source, the fourth transistor having a gate electrode coupled to a first input terminal of the input terminals; a fifth transistor between the first power source and the second node, the fifth transistor having a gate electrode coupled to the first input terminal; and a sixth transistor between the second node and the second power source, the sixth transistor having a gate electrode coupled to a second input terminal of the input terminals.

According to an aspect of another exemplary embodiment of the present invention, there is provided an organic light emitting display device, including a scan driver for sequentially supplying scan signals to scan lines; a data driver for supplying data signals to data lines; pixels positioned at crossing regions of the scan lines and the data lines; and an emission control driver for supplying emission control signals to emission control lines formed in parallel with corresponding scan lines of the scan lines, wherein the emission control driver includes a plurality of stages, each of the plurality of stages including an output terminal coupled to a corresponding one of the emission control lines; input terminals respectively coupled to two or more scan lines of the scan lines for generating a corresponding one of the emission control signals; an input circuit for controlling voltages at a first node and a second node corresponding to scan signals supplied from the two or more scan lines; and an output circuit coupled to the input circuit, the output circuit for controlling the corresponding one of the emission control signals according to the voltages at the first node and the second node.

In an emission control driver and an organic light emitting display device using the same according to exemplary embodiments of the present invention, emission control signals can be generated using scan signals, without using any separate clock signals. Further, since emission control signals are generated using scan signals, the structure of a circuit included in each stage may be simplified and/or reduced. Accordingly, manufacturing costs can be reduced, and the mounting area of the emission control driver can also be reduced.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF EXEMPLARY EMBODIMENTS

Figure 1:
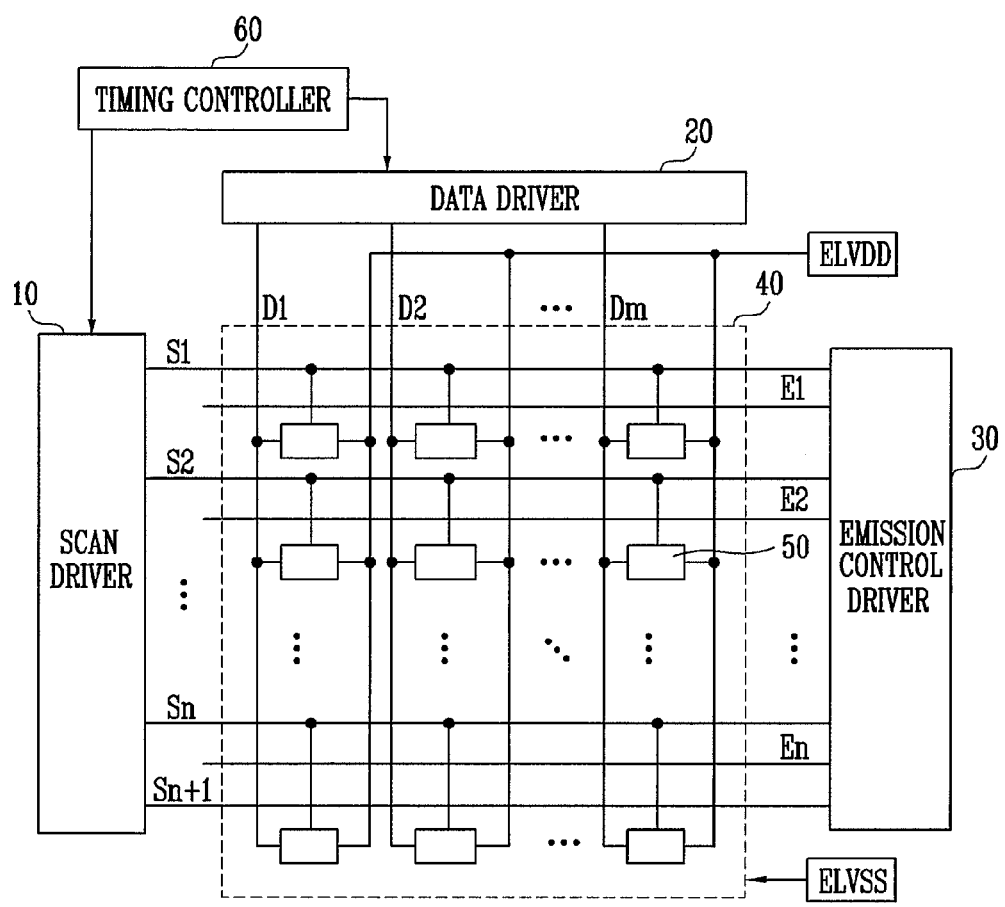
FIG. 1 is a schematic block diagram of an organic light emitting display device according to an embodiment of the present invention.

Hereinafter, certain exemplary embodiments according to the present invention will be described with reference to the accompanying drawings. Here, when a first element is described as being coupled to a second element, the first element may be directly coupled to the second element, or may be indirectly coupled to the second element via one or more additional elements. Further, some of the elements that are not essential to the complete understanding of the invention are omitted for clarity. In addition, like reference numerals refer to like elements throughout.

FIG. 1 is a schematic block diagram of an organic light emitting display device according to an embodiment of the present invention. Although FIG. 1 illustrates a scan driver 10 and an emission control driver 30 separated from each other, in some embodiments, the emission control driver 30 may be included in the scan driver 10.

Referring to FIG. 1, the organic light emitting display device according to an embodiment of the present invention includes a display unit 40 including a plurality of pixels 50 coupled to scan lines S1 to Sn, data lines D1 to Dm and emission control lines E1 to En; a scan driver 10 for driving the scan lines S1 to Sn; a data driver 20 for driving the data lines D1 to Dm; an emission control driver 30 for driving the emission control lines E1 to En; and a timing controller 60 for controlling the scan driver 10, the data driver 20 and the emission control driver 30.

The scan driver 10 sequentially supplies a scan signal to the scan lines S1 to Sn under the control of the timing controller 60. Accordingly, the pixels 50 coupled to the scan lines S1 to Sn are sequentially selected.

The data driver 20 supplies data signals to the data lines D1 to Dm under the control of the timing controller 60. Here, the data driver 20 supplies data signals to the data lines D1 to Dm when a scan signal is supplied from the scan driver 10. Then, the data signals are supplied to the pixels 50 selected by the scan signal, and each of the pixels 50 is supplied with a voltage corresponding to the data signal for the respective pixel to be charged therewith.

The emission control driver 30 sequentially supplies an emission control signal to the emission control lines E1 to En under the control of the timing controller 60. The emission control driver 30 supplies an emission control signal to pixels 50, such that the pixels 50 are in a non-emission state during the period when data signals are supplied to the respective pixels 50. The emission control driver 30 does not supply the emission control signal to the pixels 50 during other periods. To this end, in one embodiment, the emission control signal supplied to a j-th ("j" is a natural number) emission control line Ej overlaps with the scan signal supplied to a j-th scan line Sj. A width of the emission control signal may be variously set depending on structures of the pixels 50. For example, the emission control signal supplied to the j-th emission control line Ej may overlap with the scan signal supplied to j-th and (j+1)-th scan lines Sj and Sj+1.

Figure 2:
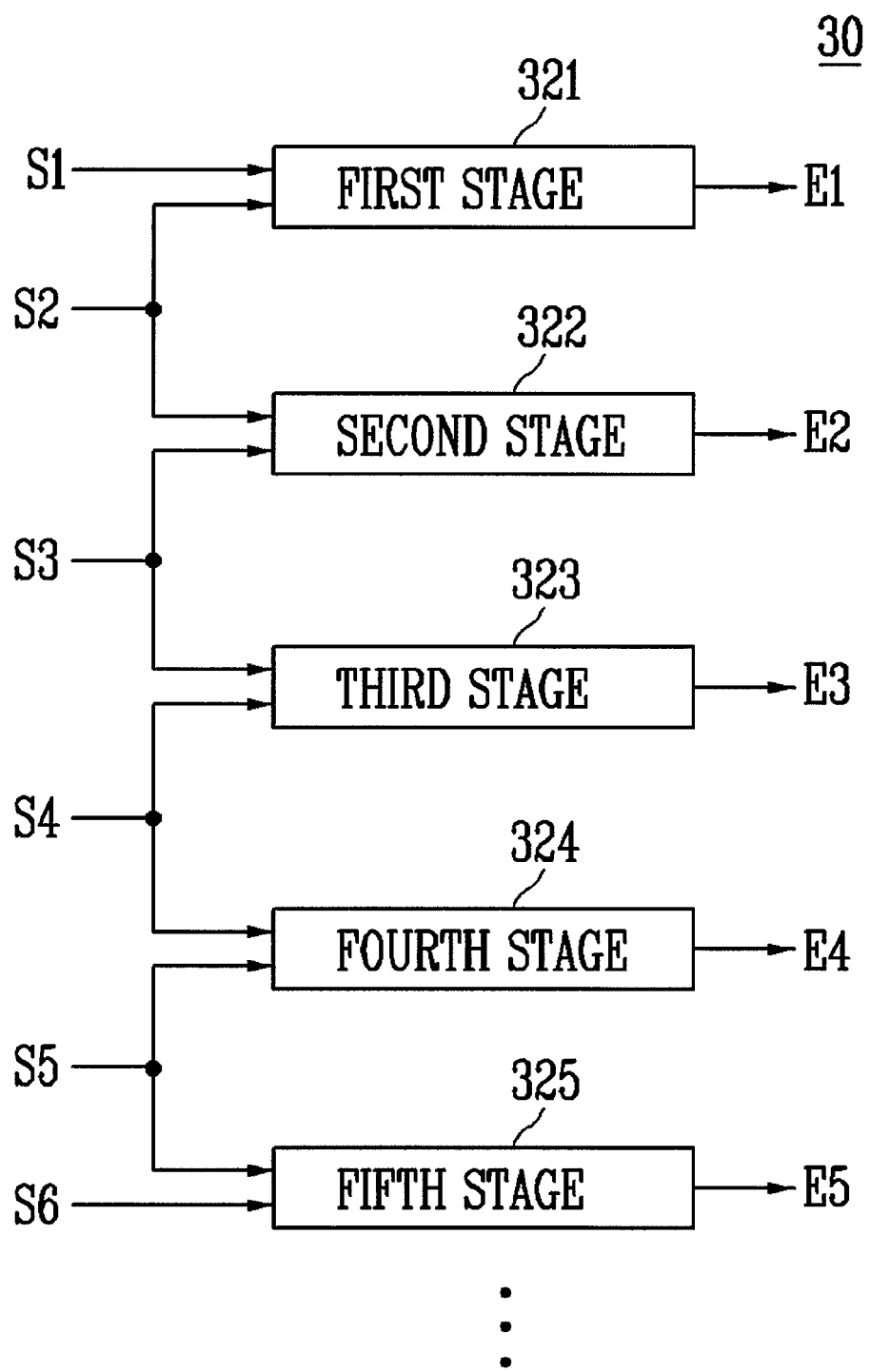
FIG. 2 is a schematic block diagram showing stages of an emission control driver shown in FIG. 1.

FIG. 2 is a schematic block diagram showing stages of an emission control driver 30 shown in FIG. 1.

Referring to FIG. 2, the emission control driver 30 according to the embodiment of the present invention includes n stages 321, 322, 323, 324, 325, etc. that respectively supply emission control signals to n emission control lines E1 to En. For convenience of illustration, five stages 321 to 325 are shown in FIG. 2. The stages 321 to 325 are coupled to the emission control lines E1 to E5, respectively, and each of the stages 321 to 325 is driven by two scan signals.

More specifically, an i-th ("i" is a natural number) stage 32i is coupled to an i-th scan line Si and an (i+1)-th scan line Si+1. The i-th stage 32i generates an emission control signal in response to scan signals respectively supplied to the i-th scan line Si and the (i+1)-th scan line Si+1. A width of the emission control signal may be controlled by changing scan lines coupled to the respective stages 32i. A more detailed description is described below.

Figure 3:
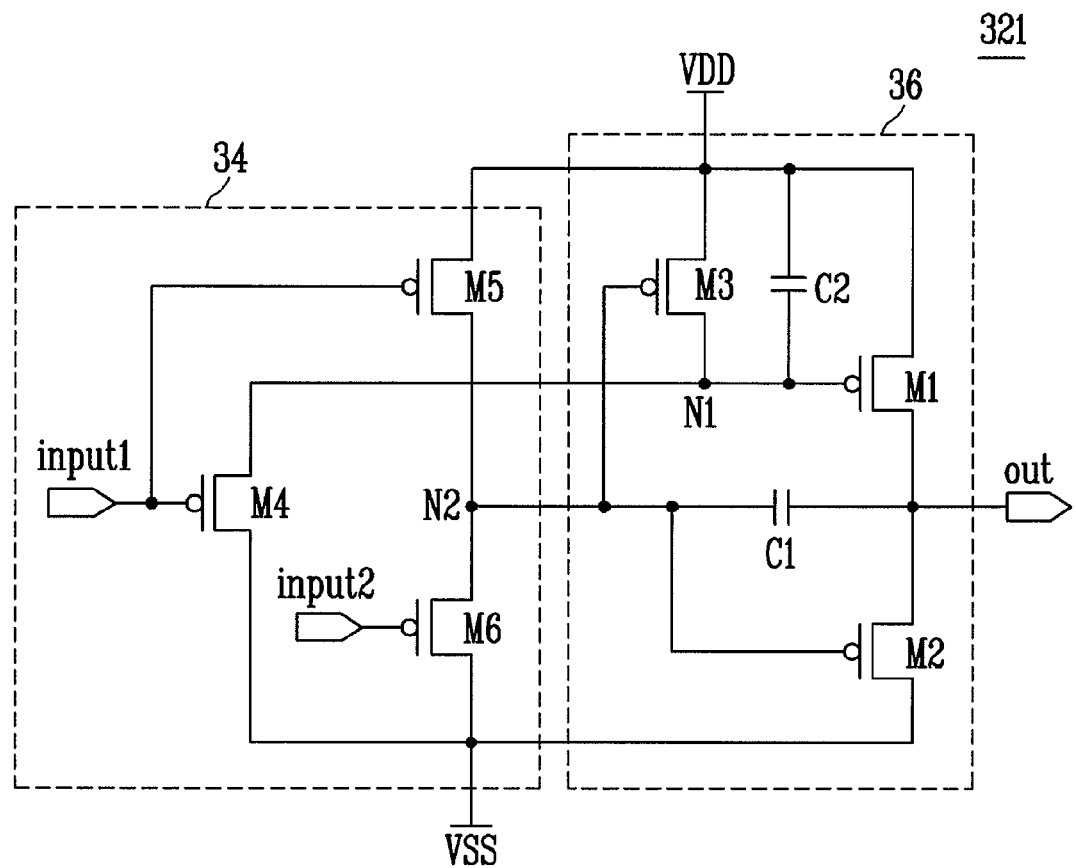
FIG. 3 is a circuit diagram of each of the stages shown in FIG. 2.

FIG. 3 is a circuit diagram of each of the stages shown in FIG. 2. For convenience of illustration, the first stage 321 is shown in FIG. 3.

Referring to FIG. 3, the stage 321 includes an input circuit 34 and an output circuit 36. Here, transistors M1 to M6 included in the respective input and output circuits 34 and 36 are PMOS transistors. In other embodiments, the transistors may be NMOS transistors, or a mix of PMOS transistors and NMOS transistors.

The output circuit 36 controls whether an emission control signal is supplied corresponding to the voltage of a first or second power source VDD or VSS in accordance with an operation of the input circuit 34. Here, the first power source VDD is set as a higher voltage than the second power source VSS. For example, the first power source VDD is set at a voltage at which the transistors M1 to M6 can be turned off, and the second power source VSS is set at a voltage at which the transistors M1 to M6 can be turned on.

The output circuit 36 includes a first transistor M1 coupled between the first power source VDD and an output terminal out; a second transistor M2 coupled between the output terminal out and the second power source VSS; a third transistor M3 and a second capacitor C2 coupled in parallel between a gate electrode of the first transistor M1 and the first power source VDD; and a first capacitor C1 coupled between a gate electrode of the second transistor M2 and the output terminal out.

A first electrode of the first transistor M1 is coupled to the first power source VDD, and a second electrode of the first transistor M1 is coupled to the output terminal out. The gate electrode of the first transistor M1 is coupled to a first node N1. The first transistor M1 is turned on or off by a voltage at the first node N1.

A first electrode of the second transistor M2 is coupled to the output terminal out, and a second electrode of the second transistor M2 is coupled to the second power source VSS. The gate electrode of the second transistor M2 is coupled to a second node N2. The second transistor M2 is turned on or off by a voltage at the second node N2.

A first electrode of the third transistor M3 is coupled to the first power source VDD, and a second electrode of the third transistor M3 is coupled to the first node N1. A gate electrode of the third transistor M3 is coupled to the second node N2. The third transistor M3 is turned on or off by the voltage at the second node N2.

The first capacitor C1 is coupled between the gate electrode of the second transistor M2 and the output terminal out. A voltage at which the second transistor M2 is turned on or off is charged in the first capacitor C1. For example, when the second transistor M2 is turned on, a voltage at which the second transistor M2 is turned on is charged in the first capacitor C1. When the second transistor M2 is turned off, a voltage at which the second transistor M2 is turned off is charged in the first capacitor C1.

The second capacitor C2 is coupled between the gate electrode of the first transistor M1 and the first power source VDD. A voltage at which the first transistor M1 is turned on or off is charged in the second capacitor C2.

The input circuit 34 controls the voltages at the first and second nodes N1 and N2 corresponding to voltages supplied to first and second input terminals input1 and input2.

To this end, the input circuit 34 includes a fifth transistor M5 coupled between the first power source VDD and the second node N2; a sixth transistor M6 coupled between the second node N2 and the second power source VSS; and a fourth transistor M4 coupled between the first node N1 and the second power source VSS.

A first electrode of the fifth transistor M5 is coupled to the first power source VDD, and a second electrode of the fifth transistor M5 is coupled to the second node N2. A gate electrode of the fifth transistor M5 is coupled to the first input terminal input1. The fifth transistor M5 is turned on or off corresponding to a voltage applied to the first input terminal input1.

A first electrode of the sixth transistor M6 is coupled to the second node N2, and a second electrode of the sixth transistor M6 is coupled to the second power source VSS. A gate electrode of the sixth transistor M6 is coupled to the second input terminal input2. The sixth transistor M6 is turned on or off by a voltage applied to the second input terminal input2.

A first electrode of the fourth transistor M4 is coupled to the first node N1, and a second electrode of the fourth transistor M4 is coupled to the second power source VSS. A gate electrode of the fourth transistor M4 is coupled to the first input terminal input1. The fourth transistor M4 is turned on or off corresponding to the voltage applied to the first input terminal input1.

Figure 4:
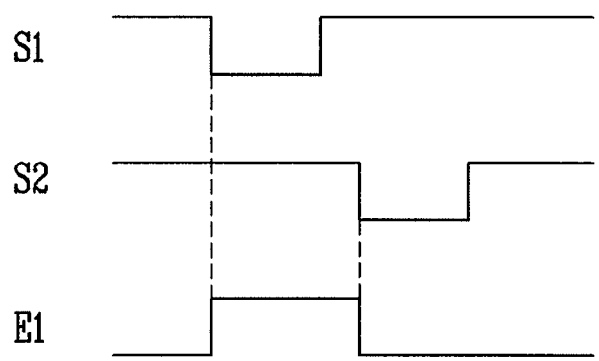
FIG. 4 is a waveform diagram showing an emission control signal outputted corresponding to scan signals supplied to the stage shown in FIG. 3.
Figure 5A:
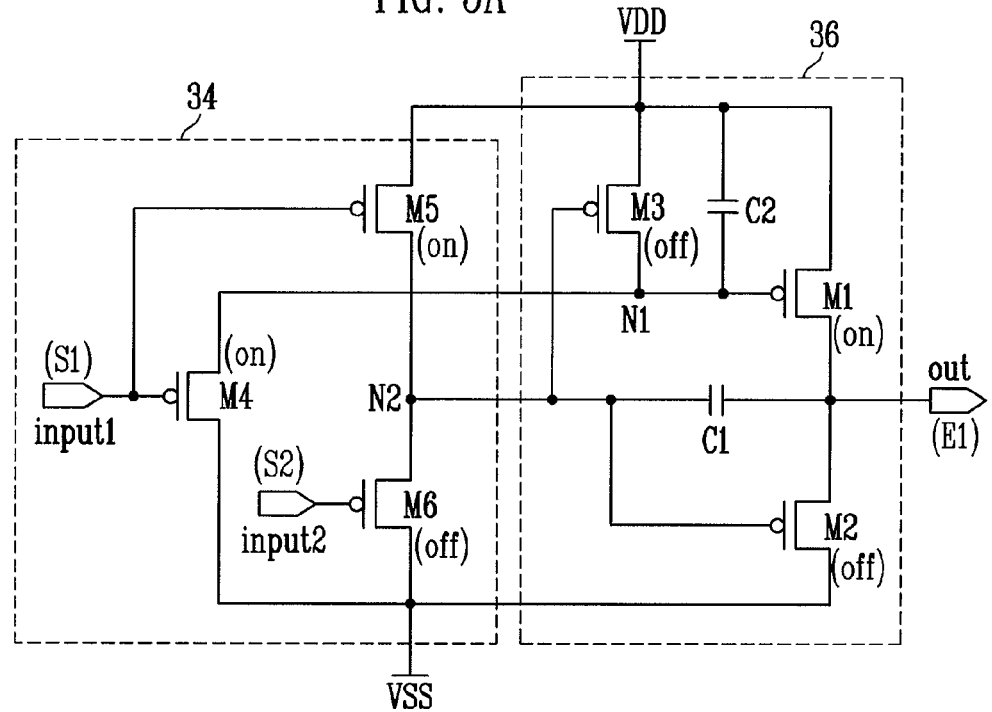
FIGS. 5A and 5B are circuit diagrams illustrating an operation of the stage corresponding to the scan signals of FIG. 4.
Figure 5B:
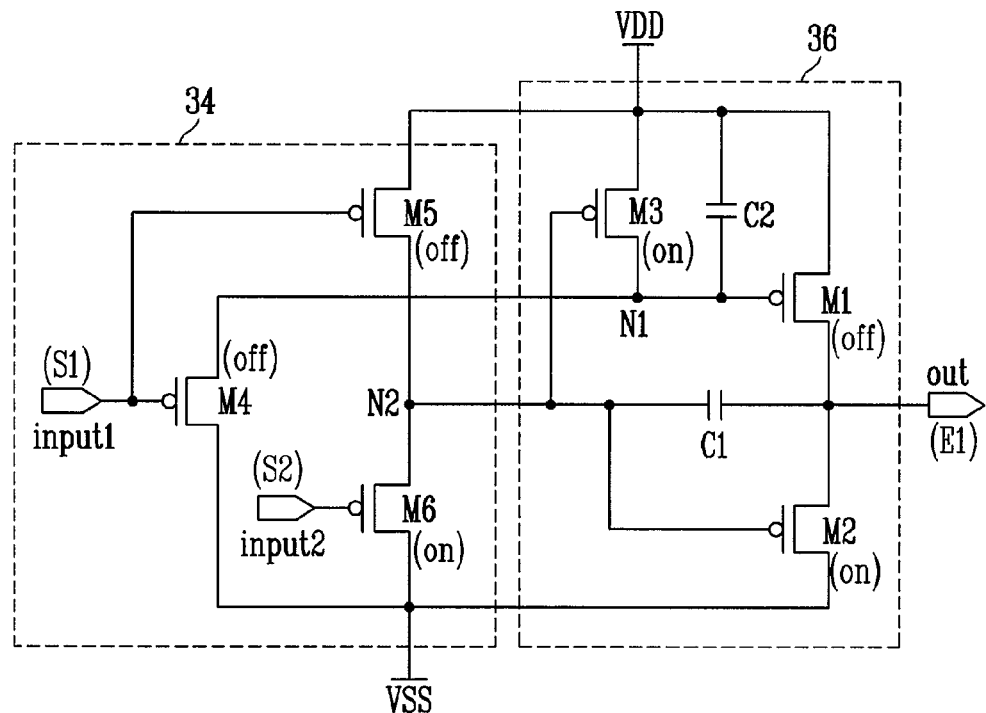

FIG. 4 is a waveform diagram showing an emission control signal outputted corresponding to scan signals supplied to the circuit diagram of the stage shown in FIG. 3. FIGS. 5A and 5B are circuit diagrams illustrating an operation of the stage corresponding to the scan signals of FIG. 4.

The operation of the stage will be described in detail with reference to FIGS. 4 to 5B. The first scan line S1 is coupled to the first input terminal input1, and the second scan line S2 is coupled to the second input terminal input2.

If a scan signal (low voltage) is supplied to the first scan line S1, the fourth and fifth transistors M4 and M5 are turned on as shown in FIG. 5A. Since a high voltage is supplied to the second scan line S2 during the period when the low voltage scan signal is supplied to the first scan line S1, the sixth transistor M6 is turned off.

If the fifth transistor M5 is turned on, the voltage of the first power source VDD is applied to the second node N2. In this case, the second and third transistors M2 and M3 coupled to the second node N2 are turned off.

If the fourth transistor M4 is turned on, the voltage of the second power source VSS is applied to the first node N1. In this case, the first transistor M1 coupled to the first node N1 is turned on. If the first transistor M1 is turned on, the voltage of the first power source VDD is applied to the output terminal out. Accordingly, an emission control signal (high voltage) is supplied to the emission control line E1 coupled to the output terminal out.

Meanwhile, the voltage at which the first transistor M1 is turned on is charged in the second capacitor C2, and the voltage at which the second transistor M2 is turned off is charged in the first capacitor C1. Accordingly, even after the fourth and fifth transistors M4 and M5 are turned off by the supply of a high voltage to the first scan line S1, the voltage of the first power source VDD is applied to the output terminal out while the first and second transistors M1 and M2 maintain turned-on and turned-off states, respectively.

Thereafter, if a scan signal (low voltage) is supplied to the second scan line S2, the sixth transistor M6 is turned on as shown in FIG. 5B. Since a high voltage is applied to the first scan line S1 during the period when the low voltage scan signal is supplied to the second scan line S2, the fourth and fifth transistors M4 and M5 are turned off.

If the sixth transistor M6 is turned on, the voltage of the second power source VSS is applied to the second node N2. In this case, the third and second transistors M3 and M2 coupled to the second node N2 are turned on.

If the third transistor M3 is turned on, the voltage of the first power source VDD is applied to the first node N1. In this case, the first transistor M1 coupled to the first node N1 is turned off. If the second transistor M2 is turned on, the voltage of the second power source VSS is applied to the output terminal out. Accordingly, the supply of the emission control signal to the emission control line E1 coupled to the output terminal out is stopped (i.e., the emission control signal becomes low voltage).

Meanwhile, the second capacitor C2 charges the voltage at which the first transistor M1 is turned off, and the first capacitor C1 charges the voltage at which the second transistor M2 is turned on. Accordingly, the voltage at the output terminal out can be maintained as the voltage of the second power source VSS until the scan signal is subsequently supplied to the first scan line S1.

Meanwhile, in embodiments of the present invention, a width of an emission control signal can be variously adjusted by controlling scan signals supplied to the respective stages 321 to 325. As an example, scan signals supplied to stages 321 to 325 can be controlled as shown in FIG. 6.

Figure 6:
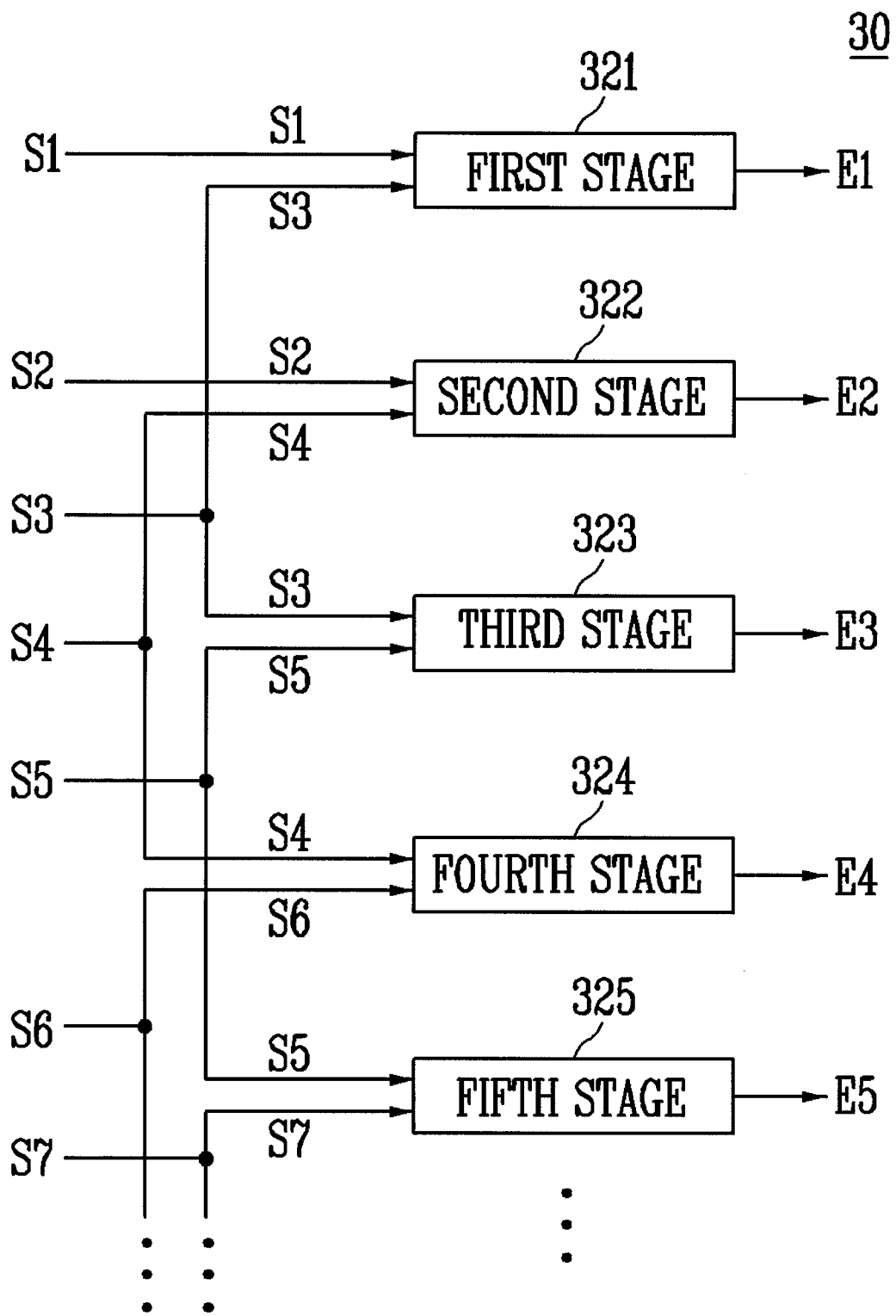
FIG. 6 is a schematic block diagram showing another embodiment of the stages of the emission control driver shown in FIG. 1.

Referring to FIG. 6, an i-th stage 32$i$ is coupled to an i-th scan line Si and an (i+2)-th scan line Si+2. Here, the i-th scan line Si is coupled to a first input terminal input1 of a circuit included in the i-th stage 32$i$, and the (i+2)-th scan line Si+2 is coupled to a second input terminal input2 of the circuit included in the i-th stage 32$i$.

Figure 7:
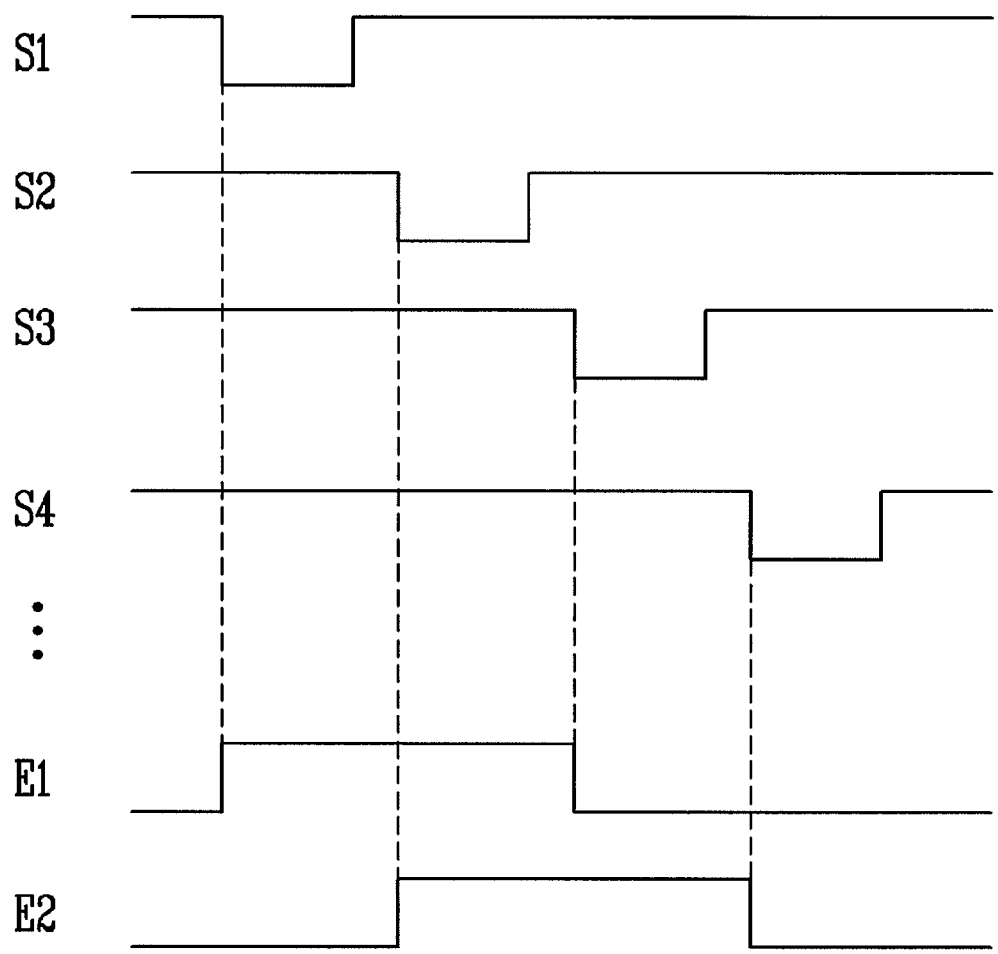
FIG. 7 is a waveform diagram showing emission control signals generated by the stages of FIG. 6.

In this case, an emission control signal (high voltage) overlapping with two scan signals (low voltage) is sequentially supplied to emission control lines E1 and E2 as shown in FIG. 7.

As described above, an emission control driver according to embodiments of the present invention can generate an emission control signal by utilizing scan signals, without utilizing any separate clock signals. In this case, a circuit supplying clock signals and additional signal lines supplying such clock signals are unnecessary, thereby reducing manufacturing costs. Furthermore, when clock signals are supplied in the related art, clock signals are supplied to all stages. Therefore, the load of the clock signals is increased, and it is difficult to ensure reliability. However, in the present invention, the same scan signal may be supplied to only two stages, thereby improving reliability.

Since in some embodiments, only two scan signals are supplied to a circuit of each of the stages, the number of transistors included in each of the stages may be reduced. Accordingly, manufacturing costs can be reduced, and the mounting area of the emission control driver can also be reduced. Further, in some embodiments, since the circuit of each of the stages is formed using PMOS transistors, the PMOS transistors can be mounted on a panel.

While the present invention has been described in connection with certain exemplary embodiments, it is to be understood that the invention is not limited to the disclosed embodiments, but is instead intended to cover various modifications and equivalent arrangements included within the spirit and scope of the appended claims, and equivalents thereof.

What is claimed is:

1. An emission control driver for supplying emission control signals to emission control lines formed in parallel with scan lines, the emission control driver comprising a plurality of stages, each of the plurality of stages comprising:
   an output terminal coupled to a corresponding one of the emission control lines;
   input terminals respectively coupled to two or more scan lines of the scan lines for generating a corresponding one of the emission control signals;
   an input circuit for controlling voltages at a first node and a second node that are separated from the output terminal, corresponding to scan signals supplied from the two or more scan lines, such that when a second scan signal of the scan signals is supplied, the voltage at at least one of the first node or the second node is configured to be different than when a first scan signal of the scan signals is supplied; and
   an output circuit coupled to the input circuit, the output circuit for controlling the corresponding one of the emission control signals according to the voltages at the first node and the second node.

2. The emission control driver of claim 1, wherein the output circuit comprises:
   a first transistor between a first power source and the output terminal, the first transistor being controlled corresponding to the voltage at the first node;
   a second transistor between the output terminal and a second power source, the second transistor being controlled corresponding to the voltage at the second node;
   a third transistor between the first node and the first power source, the third transistor being controlled corresponding to the voltage at the second node;
   a first capacitor between a gate electrode of the second transistor and the output terminal; and
   a second capacitor between a gate electrode of the first transistor and the first power source.

3. The emission control driver of claim 2, wherein the input circuit comprises:
   a fourth transistor between the first node and the second power source, the fourth transistor having a gate electrode coupled to a first input terminal of the input terminals;
   a fifth transistor between the first power source and the second node, the fifth transistor having a gate electrode coupled to the first input terminal; and
   a sixth transistor between the second node and the second power source, the sixth transistor having a gate electrode coupled to a second input terminal of the input terminals.

4. The emission control driver of claim 3, wherein the first input terminal of a stage of the plurality of stages coupled to an i-th ("i" is a natural number) emission control line of the emission control lines is coupled to an i-th scan line of the scan lines, and the second input terminal of the stage is coupled to an (i+1)-th scan line of the scan lines.

5. The emission control driver of claim 3, wherein the first input terminal of a stage of the plurality of stages coupled to an i-th ("i" is a natural number) emission control line of the emission control lines is coupled to an i-th scan line of the scan lines, and the second input terminal of the stage is coupled to an (i+2)-th scan line of the scan lines.

6. The emission control driver of claim 3, wherein the first power source is set at a higher voltage than a voltage of the second power source.

7. The emission control driver of claim 6, wherein the first power source is set at a voltage at which the first to sixth transistors are turned off, and the second power source is set at a voltage at which the first to sixth transistors are turned on.

8. The emission control driver of claim 3, wherein the first to sixth transistors are PMOS transistors.

9. The emission control driver of claim 1, wherein each of the plurality of stages is directly coupled to only two of the scan lines.

10. An organic light emitting display device, comprising:
    a scan driver for sequentially supplying scan signals to scan lines;
    a data driver for supplying data signals to data lines;
    pixels positioned at crossing regions of the scan lines and the data lines; and
    an emission control driver for supplying emission control signals to emission control lines formed in parallel with corresponding scan lines of the scan lines,
    wherein the emission control driver comprises a plurality of stages, each of the plurality of stages comprising:
       an output terminal coupled to a corresponding one of the emission control lines;
       input terminals respectively coupled to two or more scan lines of the scan lines for generating a corresponding one of the emission control signals;
       an input circuit for controlling voltages at a first node and a second node that are separated from the output terminal, corresponding to scan signals supplied from the two or more scan lines, such that when a second scan signal of the scan signals is supplied, the voltage at at least one of the first node or the second node is configured to be different than when a first scan signal of the scan signals is supplied; and
       an output circuit coupled to the input circuit, the output circuit for controlling the corresponding one of the emission control signals according to the voltages at the first node and the second node.

11. The organic light emitting display device of claim 10, wherein the output circuit comprises:

a first transistor between a first power source and the output terminal, the first transistor being controlled corresponding to the voltage at the first node;

a second transistor between the output terminal and a second power source, the second transistor being controlled corresponding to the voltage at the second node;

a third transistor between the first node and the first power source, the third transistor being controlled corresponding to the voltage at the second node;

a first capacitor between a gate electrode of the second transistor and the output terminal; and a second capacitor between a gate electrode of the first transistor and the first power source.

12. The organic light emitting display device of claim 11, wherein the input circuit comprises:

a fourth transistor between the first node and the second power source, the fourth transistor having a gate electrode coupled to a first input terminal of the input terminals;

a fifth transistor between the first power source and the second node, the fifth transistor having a gate electrode coupled to the first input terminal; and a sixth transistor between the second node and the second power source, the sixth transistor having a gate electrode coupled to a second input terminal of the input terminals.

13. The organic light emitting display device of claim 12, wherein the first input terminal of a stage of the plurality of stages coupled to an i-th ("i" is a natural number) emission control line of the emission control lines is coupled to an i-th scan line of the scan lines, and the second input terminal of the stage is coupled to an (i+1)-th scan line of the scan lines.

14. The organic light emitting display device of claim 12, wherein the first input terminal of a stage of the plurality of stages coupled to an i-th ("i" is a natural number) emission control line of the emission control lines is coupled to an i-th scan line of the scan lines, and the second input terminal of the stage is coupled to an (i+2)-th scan line of the scan lines.

15. The organic light emitting display device of claim 10, wherein each of the plurality of stages of the emission control driver is configured to supply a high emission control signal from a time when a low scan signal is supplied from a first scan line of the corresponding two or more scan lines, to a time when a low scan signal is supplied from a second scan line of the corresponding two or more scan lines.

16. The organic light emitting display device of claim 10, wherein the emission control driver supplies the emission control signals without utilizing any clock signals.

* * * * *